(12) United States Patent
Venugopal et al.

(10) Patent No.: US 8,271,121 B2
(45) Date of Patent: Sep. 18, 2012

(54) METHODS AND ARRANGEMENTS FOR IN-SITU PROCESS MONITORING AND CONTROL FOR PLASMA PROCESSING TOOLS

(75) Inventors: Vijayakumar C. Venugopal, Berkeley, CA (US); Neil Martin Paul Benjamin, East Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 254 days.

(21) Appl. No.: 12/826,560

(22) Filed: Jun. 29, 2010

(65) Prior Publication Data

US 2010/0332011 A1    Dec. 30, 2010

Related U.S. Application Data

(63) Continuation-in-part of application No. 12/555,674, filed on Sep. 8, 2009.

(60) Provisional application No. 61/222,102, filed on Jun. 30, 2009, provisional application No. 61/222,024, filed on Jun. 30, 2009.

(51) Int. Cl.
    *G06F 19/00* (2006.01)
(52) U.S. Cl. .................. 700/121; 700/110; 438/680
(58) Field of Classification Search .................. 700/121, 700/123, 101; 438/28, 680; 73/514.24; 250/263; 714/11; 718/105
    See application file for complete search history.

(56) References Cited

U.S. PATENT DOCUMENTS

| | | | |
|---|---|---|---|
| 4,310,880 A | 1/1982 | Gehman | |
| 4,443,848 A | 4/1984 | Gehman | |
| 5,272,872 A * | 12/1993 | Grutter et al. | ................ 60/274 |
| 5,479,340 A | 12/1995 | Fox et al. | |
| 5,640,518 A | 6/1997 | Muhich et al. | |
| 5,971,591 A | 10/1999 | Vona et al. | |
| 6,192,287 B1 | 2/2001 | Solomon et al. | |
| 6,332,961 B1 | 12/2001 | Johnson et al. | |

(Continued)

FOREIGN PATENT DOCUMENTS

JP    2003-197609 A    7/2003

(Continued)

OTHER PUBLICATIONS

"Non Final Office Action", U.S. Appl. No. 12/555,674, Mailing Date: Dec. 23, 2011.

(Continued)

*Primary Examiner* — Kidest Bahta
(74) *Attorney, Agent, or Firm* — UPSG, P.C., Intellectual Property Law

(57) ABSTRACT

An arrangement for implementing an automatic in-situ process control scheme during execution of a recipe is provided. The arrangement includes control-loop sensors configured at least for collecting a first set of sensor data to facilitate monitoring set points during the recipe execution, wherein the control-loop sensors being part of a process control loop. The arrangement also includes independent sensors configured at least for collecting a second set of sensor data, which is not part of the process control loop. The arrangement yet also includes a hub configured for at least receiving at least one of the first set of sensor data and the second set of sensor data. The arrangement yet further includes an analysis computer communicably coupled with the hub and configured for performing analysis of at least one of the first set of sensor data and the second set of sensor data.

20 Claims, 5 Drawing Sheets

U.S. PATENT DOCUMENTS

| | | | |
|---|---|---|---|
| 6,665,576 B2 | 12/2003 | Hayashi | |
| 6,745,096 B2 | 6/2004 | Yamamoto et al. | |
| 6,824,627 B2 | 11/2004 | Dhindsa et al. | |
| 6,825,050 B2 * | 11/2004 | Huang et al. | 438/5 |
| 6,879,867 B2 | 4/2005 | Tanaka et al. | |
| 6,895,293 B2 | 5/2005 | Reiss et al. | |
| 6,902,646 B2 | 6/2005 | Mahoney | |
| 6,969,619 B1 | 11/2005 | Winniczek | |
| 7,010,374 B2 | 3/2006 | Tanaka et al. | |
| 7,016,811 B2 | 3/2006 | Peck et al. | |
| 7,058,467 B2 | 6/2006 | Tanaka et al. | |
| 7,062,411 B2 | 6/2006 | Hopkins et al. | |
| 7,082,345 B2 | 7/2006 | Shanmugasundram et al. | |
| 7,107,115 B2 | 9/2006 | Tanaka et al. | |
| 7,113,838 B2 | 9/2006 | Funk et al. | |
| 7,123,980 B2 | 10/2006 | Funk et al. | |
| 7,146,237 B2 | 12/2006 | Lev-Ami et al. | |
| 7,158,848 B2 | 1/2007 | Tanaka et al. | |
| 7,356,580 B1 | 4/2008 | Huang et al. | |
| 7,376,479 B2 | 5/2008 | Tanaka et al. | |
| 7,413,672 B1 | 8/2008 | Keil et al. | |
| 7,477,960 B2 | 1/2009 | Willis et al. | |
| 7,493,185 B2 | 2/2009 | Cheng et al. | |
| 7,565,220 B2 | 7/2009 | Huang et al. | |
| 7,620,511 B2 | 11/2009 | Shannon et al. | |
| 7,647,237 B2 | 1/2010 | Malave et al. | |
| 7,668,615 B2 | 2/2010 | Goff et al. | |
| 7,676,295 B2 | 3/2010 | Weetman | |
| 7,793,162 B2 | 9/2010 | Mock et al. | |
| 7,805,639 B2 | 9/2010 | Mock et al. | |
| 7,829,468 B2 | 11/2010 | Keil et al. | |
| 7,835,814 B2 | 11/2010 | Mock et al. | |
| 7,848,898 B2 | 12/2010 | Shannon et al. | |
| 7,960,670 B2 * | 6/2011 | Mundt et al. | 219/121.54 |
| 7,967,995 B2 | 6/2011 | Funk et al. | |
| 8,000,827 B2 | 8/2011 | Weetman et al. | |
| 8,005,562 B2 | 8/2011 | Baek et al. | |
| 2002/0163637 A1 * | 11/2002 | Rossman et al. | 356/237.4 |
| 2003/0223055 A1 | 12/2003 | Agarwal et al. | |
| 2004/0004708 A1 | 1/2004 | Willis | |
| 2004/0055868 A1 * | 3/2004 | O'Leary et al. | 204/157.15 |
| 2004/0175880 A1 | 9/2004 | Tanaka et al. | |
| 2005/0055175 A1 | 3/2005 | Jahns et al. | |
| 2005/0084988 A1 | 4/2005 | Huang et al. | |
| 2005/0130125 A1 | 6/2005 | Zagyansky | |
| 2005/0159911 A1 | 7/2005 | Funk et al. | |
| 2005/0171627 A1 | 8/2005 | Funk et al. | |
| 2006/0049831 A1 | 3/2006 | Anwar et al. | |
| 2006/0144335 A1 * | 7/2006 | Lee et al. | 118/719 |
| 2006/0180570 A1 | 8/2006 | Mahoney | |
| 2007/0110043 A1 | 5/2007 | Girard | |
| 2007/0226540 A1 | 9/2007 | Konieczny | |
| 2008/0082579 A1 | 4/2008 | Huang et al. | |
| 2008/0082653 A1 | 4/2008 | Huang et al. | |
| 2008/0243988 A1 | 10/2008 | Huang et al. | |
| 2010/0332014 A1 | 12/2010 | Albarede et al. | |

FOREIGN PATENT DOCUMENTS

| | | |
|---|---|---|
| KR | 10-2005-0030342 A | 3/2005 |
| KR | 10-2008-0006750 A | 1/2008 |
| WO | WO-2004/102642 A2 | 11/2004 |

OTHER PUBLICATIONS

"International Search Report", Issued in PCT Application No. PCT/US2010/040478; Mailing Date: Dec. 28, 2010.

"Written Opinion", Issued in PCT Application No. PCT/US2010/040478; Mailing Date: Dec. 28, 2010.

"1nternationW Preliminary Report on Patentability", PCT Application No. PCT/US2010/042933, Mailing Date: Jan. 12, 2012.

"International Preliminary Report on Patentability", PCT Application No. PCT/US2010/040456, Mailing Date: Jan. 12, 2012.

"International Preliminary Report on Patentability", PCT Application No. PCT/US2010/040465, Mailing Date: Jan. 12, 2012.

"International Preliminary Report on Patentability", PCT Application No. PCT/US2010/040468, Mailing Date: Jan. 12, 2012.

"International Preliminary Report on Patentability", PCT Application No. PCT/US2010/040477, Mailing Date: Jan. 12, 2012.

"International Preliminary Report on Patentability", PCT Application No. PCT/US2010/040478, Mailing Date: Jan. 12, 2012.

"International Search Report", Issued in PCT Application No. PCT/US2010/040477; Mailing Date: Feb. 8, 2011.

"Written Opinion", Issued in PCT Application No. PCT/US2010/040477; Mailing Date: Feb. 8, 2011.

"International Search Report", Issued in PCT Application No. PCT/US2010/042933; Mailing Date: Feb. 18, 2011.

"Written Opinion", Issued in PCT Application No. PCT/US2010/042933; Mailing Date: Feb. 18, 2011.

"International Search Report", Issued in PCT Application No. PCT/US2010/040456; Mailing Date: Jan. 21, 2011.

"Written Opinion", Issued in PCT Application No. PCT/US2010/040456; Mailing Date: Jan. 21, 2011.

"International Search Report", Issued in PCT Application No. PCT/US2010/040465; Mailing Date: Jan. 17, 2011.

"Written Opinion", Issued in PCT Application No. PCT/US2010/040465; Mailing Date: Jan. 17, 2011.

"International Search Report", Issued in PCT Application No. PCT/US2010/040468; Mailing Date: Jan. 17, 2011.

"Written Opinion", Issued in PCT Application No. PCT/US2010/040468; Mailing Date: Jan. 17, 2011.

* cited by examiner

METHODS AND ARRANGEMENTS FOR IN-SITU PROCESS MONITORING AND CONTROL FOR PLASMA PROCESSING TOOLS

CROSS REFERENCE TO RELATED APPLICATIONS

The present invention claims priority under 35 U.S.C. 119 (e) to a commonly owned provisionally filed patent application entitled "Methods and Systems for Advance Equipment Control/Advance Process Control for Plasma Processing Tools," U.S. Application No. 61/222,102, filed on Jun. 30, 2009, by inventors Venugopal et al., all of which is incorporated herein by reference.

This continuation-in-part application claims priority under 37 CFR 1.53(b) of and claims the benefit under 35 U.S.C. §120 to a commonly assigned patent application entitled "Arrangement for Identifying Uncontrolled Events at the Process Module Level and Methods Thereof," by Huang et al., application Ser. No. 12/555,674 filed on Sep. 8, 2009, which is related to and claims priority under 35 U.S.C. §119(e) to a commonly assigned provisional patent application entitled "Arrangement for Identifying Uncontrolled Events at the Process Module Level and Methods Thereof," by Huang et al., Application Ser. No. 61/222,024, filed on Jun. 30, 2009, all of which is incorporated by reference herein.

BACKGROUND OF THE INVENTION

In a competitive market, semiconductor device manufacturers need to minimize waste and consistently produce high quality semiconductor devices to maintain a competitive edge. Accordingly, tight control of the processing environment is advantageous to achieve optimal results during substrate processing. Thus, manufacturing companies have dedicated time and resources to identify methods and/or arrangements for improving substrate processing.

In order to provide tight control of the processing environment, characterization of the processing environment may be required. To provide the data needed to characterize the processing environment of a processing chamber, sensors may be employed to capture processing data during the execution of a recipe. The data may be analyzed and the processing environments may be adjusted accordingly (e.g., "to tune a recipe").

Typically analysis is performed after a single substrate or a substrate lot has been processed. The measurement is usually performed offline by one or more metrology tools. The method usually requires time and skill to take the measurements and/or to analyze the measurement data. If a problem is identified, additional time may be required to cross-reference the measurement data with the processing data to determine cause of the problem. Usually, the analysis may be complex and may require expert human interpretation. Furthermore, the analysis is usually not performed until at least one, and probably several, substrates have been processed. Since the analysis is not performed in-situ and in real time, damage and or undesirable effects may have already occurred to the substrate(s) and/or the processing chamber/chamber parts.

In some plasma processing tools, the sensors may be integrated as part of the process control loop. Thus, the sensors not only collect processing data but may also be employed as a monitoring tool. In an example, a pressure manometer may be employed to collect pressure data. However, the data collected by the pressure manometer may be employed by the processing module controller to adjust the pressure set point, for example, during the execution of the recipe.

To facilitate discussion, FIG. 1 shows a simple block diagram of a processing chamber. The diagram is not meant to be an exact representation of a processing chamber. Instead, the diagram is meant to illustrate how a set of sensors may have been implemented within a processing chamber in order to facilitate the execution of a process recipe.

Consider the situation wherein, for example, a substrate lot is to be processed within a processing chamber 100. Prior to processing, metrology tool 102 (which may be one or more metrology tools) may be employed to perform pre-processing measurements. The pre-processing measurement data from metrology tool 102 may be uploaded via a link 104 to a fabrication facility host controller 106.

To begin processing a substrate lot, a user may employ fabrication facility host controller 106 to choose a recipe for execution. In some instances, the measurement data may be employed by fabrication facility host controller 106 to adjust the recipe set points in order to compensate for the incoming material differences. In an example, the pre-processing measurement data of a substrate may indicate that the physical characteristic of the substrate is different than what is expected by the recipe. As a result, the recipe set points may be adjusted to account for the known differences in the substrate.

Once the recipe has been chosen and the recipe has been adjusted based on the pre-measurement data, fabrication facility host controller 106 may send the recipe to a process module (PM) controller 108 via a link 110. A substrate 112 may be loaded into processing chamber 100. Substrate 112 may be positioned between a lower electrode 114 (such as an electrostatic chuck) and an upper electrode 116. During processing, a plasma 118 may be formed to process (e.g., etch) substrate 112.

During processing, a plurality of sensors may be employed to monitor the state of processing chamber 100, plasma 118, and/or substrate 112. Examples of sensors may include but are not limited to: a gas flow controller (120), temperature sensors (122 and 124), a pressure sensor (126), a set of match box controllers (128), a radio frequency (RF) controller (130), a valve controller (132), a turbo pump controller (134), and the like. In an example, pressure sensor 126 may be capturing pressure data within processing chamber 100. In another example, RF generator controller 130 and/or set of match box controllers 128 may be collecting data about reflective power, impedance, harmonics and the like.

The data collected by each of the sensors may be forwarded along communication lines (such as 140, 142, 144, 146, 148, 150, and 152) to a control data hub 136 for analysis. If any one recipe set point needs to be adjusted based on the analysis, control data hub 136 may send the result to process module controller 108 (via link 138) and process module controller 108 may adjust the recipe set point accordingly. In an example, the desired pressure set point according to the recipe may be set to 30 millitorrs. However, according to pressure sensor 126, the pressure measurement is actually 26 millitorrs. As a result, process module controller 108 may adjust a pressure control actuator to bring the pressure back to the desired recipe set point.

A uni-variate orthogonal control scheme is typical of a process control relationship implemented between recipe set points and sensors. In other words, a recipe set point may be associated with data collected from a single sensor which is considered to be only responsive to a single parameter. Data collected from any other sensor is usually not considered in determining whether a specific recipe set point is followed.

In the example above, the chamber pressure is adjusted based on the data provided by pressure sensor 126. In making the adjustment, process module controller 108 may be assuming that pressure sensor 126 is providing accurate data and that pressure sensor 126 is not suffering from drifts and/or part wear. However, if pressure sensor 126 has actually drifted, the increase in pressure by process module controller 108 in an attempt to bring the chamber condition back to the desired state may result in undesirable results on substrate 112, and abnormal conditions appertaining to the chamber walls and components therein (including the sensors themselves).

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
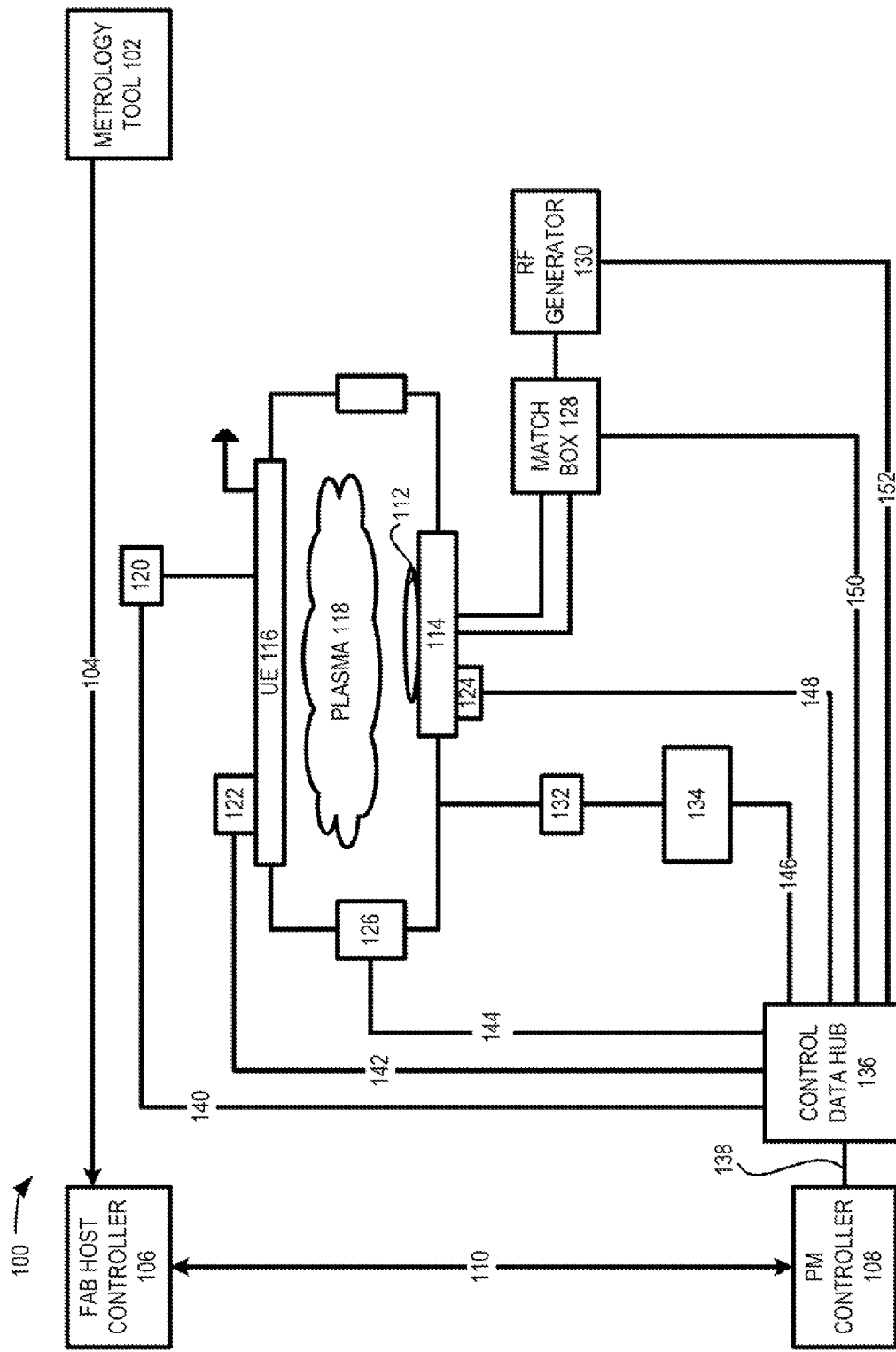
FIG. 1 shows a simple block diagram of a processing chamber.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As previously mentioned, tight control of the processing environment is desirable in order to perform substrate processing with consistent results. However, recipe adjustment typically based on uni-variate sensor data has proven to be, on occasion, fallible given that sensors may be inaccurate, have sensitivity to multiple parameters, drift over time, and/or become defective.

Those skilled in the art are aware that some parameters may be more important in the characterization of a substrate than others. In an example, the ability to control the electron density as a processing parameter may provide a tighter control over substrate processing results than the ability to control the pressure level which is less direct. However, not all parameters may be directly measured with ease by a single sensor. In addition, not all parameters may be controlled by a single direct physical actuator/controller. For example, the pressure level may be measured by a pressure manometer. Thus, if the pressure measurement shows that the pressure has deviated from that is desired, a pressure controller may be employed to adjust the pressure in the chamber to compensate. However, the electron density is a parameter that may not be directly measurable by a single sensor. Instead, to determine the electron density, complex computation may have to be performed since the electron density may have to be derived from a plurality of processing data points from one or more sensors. Further, a simple direct physical actuator may not be available for controlling electron density during substrate processing.

In one aspect of the invention, the inventors herein realized that by utilizing an independent data stream (one that is obtained from one or more sensors independent of the direct process control loop), validation may be provided before and after recipe tuning is performed. In addition, the inventors herein realized that parameters that may not be directly measured may be derived using algorithmic/model based calculations and employed to perform recipe adjustment.

In accordance with embodiments of the present invention, methods and arrangements for enabling in-situ process control are provided. Embodiments of the invention include an arrangement for providing an independent data stream. An independent data stream may include data collected from control-loop sensors and/or independent sensors. Embodiments of the invention also include an automatic multi-variate non-orthogonal control scheme for providing virtual sensors and/or virtual actuators to perform fault detection, fault classification, and/or recipe tuning.

As discussed herein, control-loop sensors refer to sensors that are also part of the process control loop. In other words, the data from the control-loop sensors are employed to monitor the recipe set points during a recipe execution. In the prior art, the data collected from the control-loop sensors are usually employed to make adjustments to the recipe set points.

As discussed herein, independent sensors refer to sensors that generally, up to now, are not part of the conventional process control loop. In an embodiment of the invention, the independent sensors are matched and calibrated from chamber to chamber. In another embodiment, the independent sensors may be redundant sensors. As an example, an independent sensor may be of the same model or type as the pressure manometer that may be employed in the process control loop. However, the independent pressure manometer is independent of the process control loop. In an embodiment, the redundant independent sensor may be positioned near the control-loop sensor with the expectation of making an independent but duplicate measurement.

As discussed herein, a virtual sensor refers to a software-implemented sensor that is not a hardware component. In an embodiment, a virtual sensor may be a composite sensor or a derivative of multiple sensors and provide virtual sensor measurements for parameters not typically directly measured. In an embodiment, the virtual parameter may be calculated and/or inferred from a plurality of data sources. Thus, with virtual sensors, parameters that may not be physically measured by a single sensor may be derived. Examples of virtual parameters may include but are not limited to, for example, ion flux, ion energy, electron density, etch rate to deposition rate ratio, and the like.

As discussed herein, virtual actuators refer to software-implemented controllers that may be employed to implement control of parameters that are not otherwise directly measurable or controllable by a single physical actuator. A physical actuator (e.g., ion flux controller) may not exist for a parameter (e.g., ion flux) because the parameter may not be directly measured with a physical sensor, for example, and may have to be calculated, e.g., indirectly derived from different data sources.

In an embodiment of the invention, methods and arrangements are provided for an in-situ process control regime. Traditionally, control-loop sensors are employed to capture processing data and to provide feedback to a processing module controller in order to adjust the recipe set points as needed. Generally, a uni-variate orthogonal control scheme is employed. In other words, a one-to-one relationship exists between a recipe set point and a sensor. Data from other sensors are usually not utilized in adjusting set points. However, data from control-loop sensors may be insufficient to verify the chamber/plasma/substrate parameters of interest. As a result, adjusting recipe set points based strictly on data from control-loop sensors may have negative consequences (e.g., a poor processing result, or even damage to the substrate, damage to the chamber walls, damage to the chamber components, and the like).

In an embodiment, an independent data stream is provided for determining certain conditions pertaining to the chamber/plasma/substrate states. In one embodiment, the independent data stream may also include data only collected from independent sensors. As aforementioned, independent sensors are sensors that are not part of the traditional process control loop. In an embodiment, the independent sensors are matched and calibrated to a universal standard. In other words, the independent sensors may be employed to capture specific characteristics of the chamber.

In one embodiment, the independent data stream may include data collected from control-loop sensors and/or independent sensors. In an example, data pertaining to pressure level may be collected by various control-loop sensors, even though only the pressure data from the pressure manometer may be utilized, for example, for setting the pressure set point. Thus, data collected by the control-loop sensors may be (but not required to be) utilized as part of the independent data stream to verify the data provided by a single control-loop sensor in this embodiment.

In an embodiment, the independent data stream may be analyzed to establish virtual sensors for determining certain conditions pertaining to the chamber/plasma/substrate states. As aforementioned, some chamber/plasma/substrate states may not be directly measured. Instead, complex computations may need to be performed in order to derive parameters that may characterize these chamber/plasma/substrate states. In an embodiment, the inventors herein realize that a hierarchical relationship exists between the recipe, sensors and on-wafer measurables that facilitate virtual metrology. In an example, by applying the independent data stream to a phenomenological model, virtual sensors such as ion flux distribution, electron density, etch rate, neutral density, and the like may be derived.

In an embodiment, the independent data stream may be analyzed alone or in conjunction with the data stream from the control-loop sensors to create virtual sensor data for adjusting a recipe parameter that is not directly measurable by a sensor. Once the virtual sensors have been created, process control may be based on virtual sensor set points that can be defined. During recipe execution, the sensor data provided by the virtual sensors may be compared against the virtual sensor set points and the difference may be calculated. A virtual actuator may then be employed to control one or more physical actuators to adjust these virtual set points.

The features and advantages of the present invention may be better understood with reference to the figures and discussions that follow.

Figure 2:
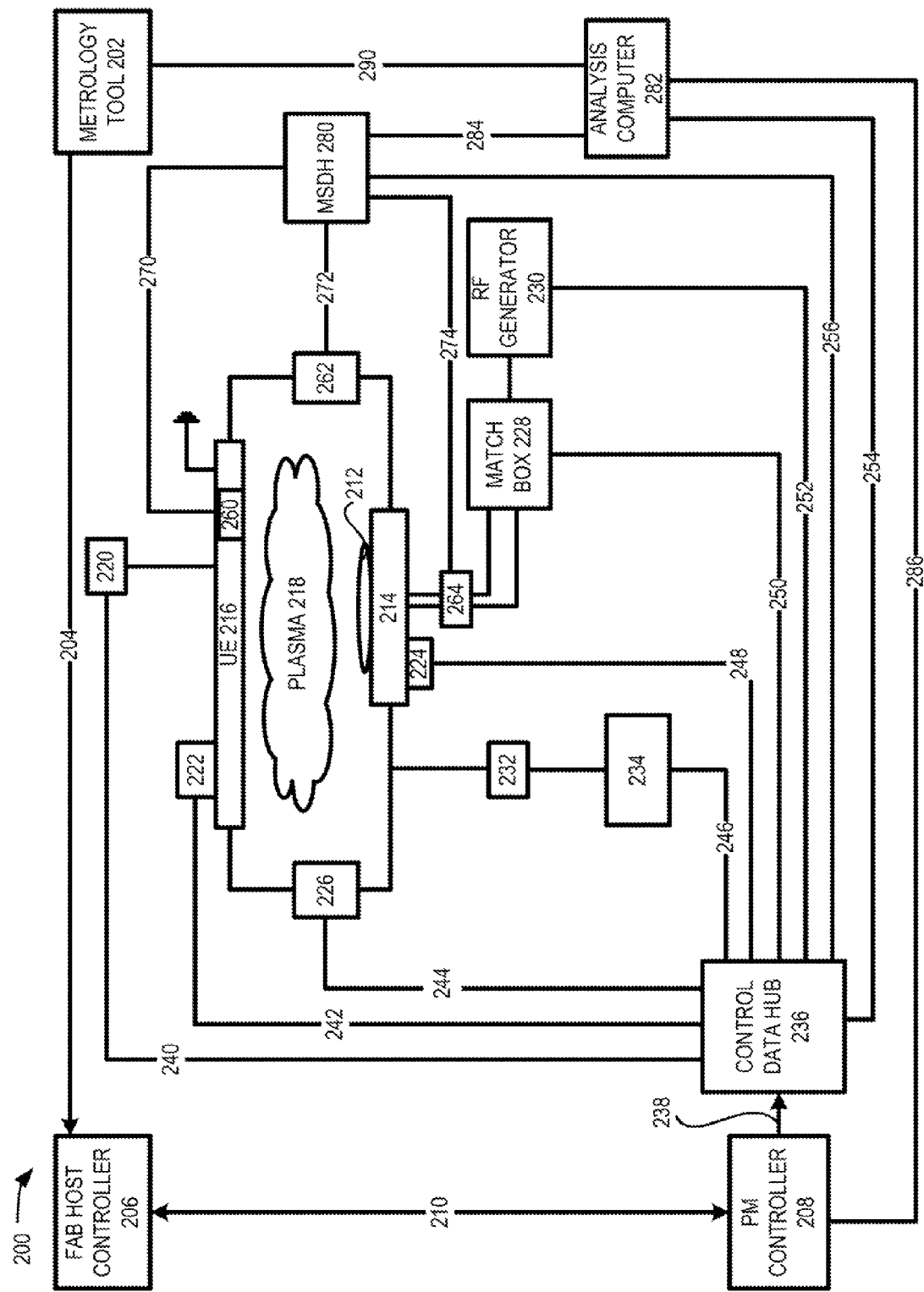
FIG. 2 shows, in an embodiment of the invention, a simple block diagram of a processing chamber with an in-situ control process arrangement.

FIG. 2 shows, in an embodiment of the invention, a simple block diagram of a processing chamber with an in-situ control process arrangement. The invention is not limited by the arrangement and/or the components shown. Instead, the diagram is meant to facilitate discussion on one embodiment of the invention as an example.

Consider the situation wherein, for example, a substrate lot is to be processed within a processing chamber 200. Before a substrate may be processed, pre-processing measurement data (external data) may be taken by a set of metrology tools 202. The measurement data from metrology tool 202 may be uploaded via a link 204 to fabrication facility host controller 206. The pre-processing measurement data are not required to implement the invention. However, processing chamber 200, in one embodiment, may provide for a communication link (204) between metrology tool 202 and fabrication facility host controller 206 to integrate metrology data into substrate processing if so desired. So doing provides a basis for compensating for variation in incoming substrates and reducing undesirable variation in outgoing product.

To initiate processing, a recipe may be selected by fabrication facility host controller 206. If pre-processing measurement data are available, adjustments may be made to the recipe to account for the incoming physical variations among substrates, for example. Once completed, fabrication facility host controller 206 may send the recipe to a process module (PM) controller 208 via a link 210. Link 210 is a bidirectional link that facilitates data exchange between fabrication facility host controller 206 and process module controller 208.

Substrate 212 may be loaded into processing chamber 200. Substrate 212 may be positioned between a lower electrode 214 (such as an electrostatic chuck) and an upper electrode 216. During processing, a plasma 218 may be formed to process (e.g., etch) substrate 212.

A plurality of sensors may be employed to monitor various parameters pertaining to processing chamber 200, plasma 218, and/or substrate 212 during recipe execution. Examples of sensors may include but are not limited to, a gas flow controller (220), temperature sensors (222 and 224), a pressure sensor (226), a set of match box controllers (228), a radio frequency (RF) controller (230), a valve controller (232), a turbo pump controller (234), and the like. In an example, temperature sensor 222 may be collecting the temperature data within processing chamber 200. In another example, turbo pump controller 234 may be collecting data about the speed of the pump and the flow rate.

For ease of discussion, the aforementioned sensors are grouped together and are hereinafter known as control-loop sensors. As discussed herein, control-loop sensors refer to sensors that are part of the process control loop and have been traditionally employed to monitor the recipe set points during a recipe execution.

In addition to the control-loop sensors that are part of the process control loop, independent sensors (e.g., 260, 262, and 264) may also be provided. In an embodiment, independent sensors are not traditionally part of the process control loop. The number of independent sensors may vary. In an embodiment of the invention, the independent sensors may be matched and calibrated against absolute standards and between themselves to give consistent results from chamber to chamber.

In an embodiment of the invention, the independent sensors are chosen and provisioned such that at least a partial overlap of data is provided for some or all data items. In other words, data about a specific virtual sensor parameter may be captured by more than one sensor. In an example, independent sensor 262 may be configured to collect data (including pressure dependent data). The data collected may overlap with pressure data collected by pressure sensor 226, for example.

In an embodiment, the independent sensors may be redundant sensors. For example, an independent sensor may be of the same model as the pressure manometer that may be employed in the process control loop. However, the independent sensor manometer is independent of the traditional process control loop.

In one embodiment, the independent sensors may be comprised of sensors that do not have a direct overlap with the control-loop sensors. In an example, voltage/current probe may be employed as one of the independent sensors employed in conjunction with the pressure sensor to derive a virtual sensor measurement.

The data collected by the control-loop sensors may be forwarded along communication lines (such as 240, 242, 244, 246, 248, 250, and 252) to a control data hub 236 for analysis (similar to prior art). In addition, the data from the independent sensors (260, 262, and 264) may also be forwarded along communication lines (270, 272, and 274) to a measurement sensor data hub 280. In one embodiment, certain data collected by the control-loop sensors may be forwarded from control data hub 236 to measurement sensor data hub 280 via a communication link 256. In another embodiment, all data collected by the control-loop sensors may be forwarded to measurement sensor data hub 280 via control data hub 236.

After collecting the data and optionally performing some pre-processing tasks (such as digital format conversion), the data may be forwarded to an analysis processor which may be implemented within a separate dedicated computer 282 via a communication line 284. In an embodiment, data collected by the control-loop sensors may also be forwarded to analysis computer 282 from control data hub 236 via a communication line 254.

As can be appreciated from the foregoing, a high volume of data may be collected by the control-loop sensors and the independent sensors. In one embodiment, the data collected by the independent sensors may be highly granular data. In an embodiment, analysis computer 282 may be a fast processing module that may be configured to handle a large volume of data. The data may be sent directly from the sensors without first having to go through the fabrication facility host controller or even the process module controller. Application Ser. No. 12/555,674, filed on Sep. 8, 2009, by Huang et al. describes an example analysis computer suitable for implementing analysis computer 282.

In one embodiment, besides data collected from the sensors, analysis computer 282 may also be receiving metrology data from metrology tool 202 via a communication link 290. In an embodiment, metrology data that may have been provided to fabrication facility host controller 206 may also be forwarded to analysis computer 282. Thus, analysis computer 282 may be configured to handle the recipe adjustment that may have previously been performed by fabrication facility host controller 206.

Figure 3:
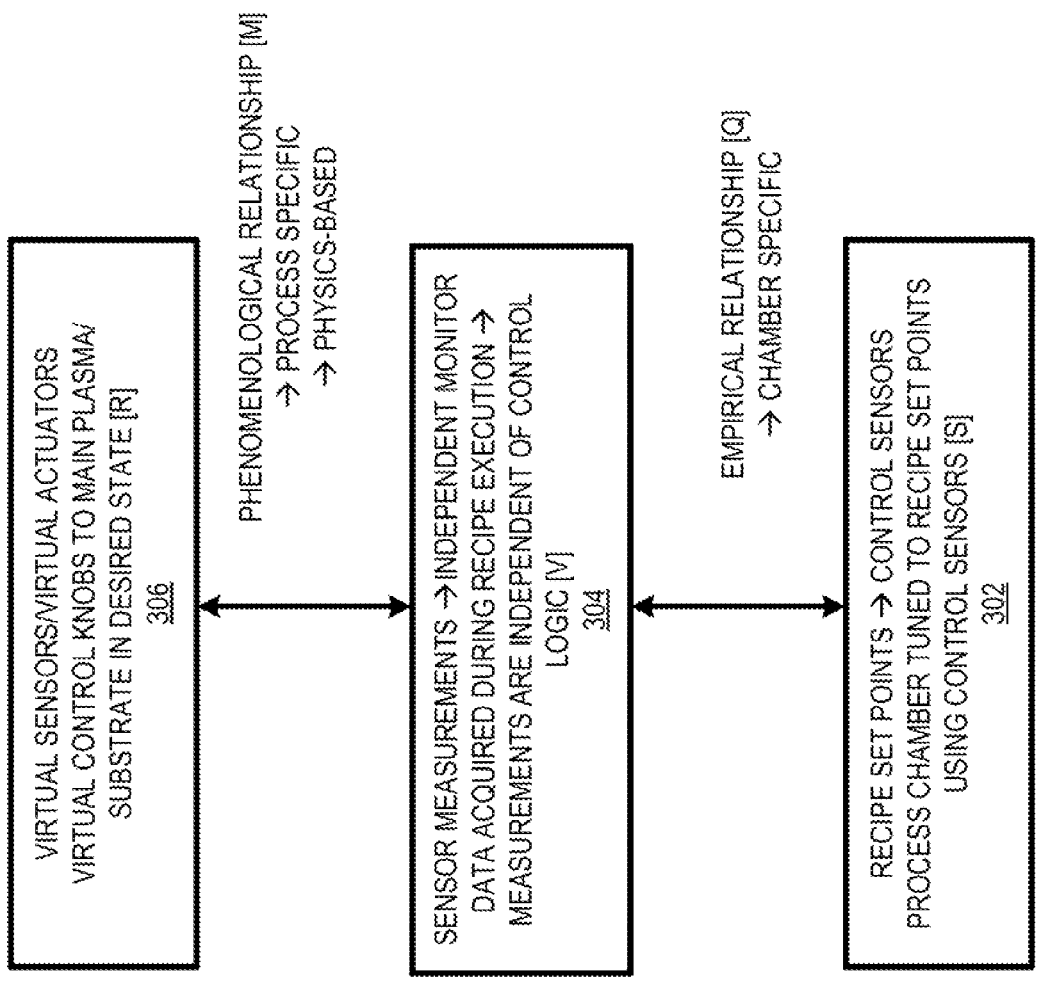
FIG. 3 shows, in an embodiment of the invention, a hierarchical relationship between the recipe, sensors and on-wafer measurables.

In an embodiment, analysis computer 282 is configured to analyze the independent data stream and the results may be sent to process module controller 208 via a communication link 286. FIG. 3 discusses an example of the hierarchical relationship that analysis computer 282 may employ in performing its analysis. In an embodiment, a high speed communication link is employed in order to provide real time updates to process module controller 208. The results from analysis computer 282 may include virtual sensor set point adjustments, fault detection and classification, and multi-sensor endpoint. Depending upon the results, process module controller 208 may adjust the recipe and/or stop the processing.

Unlike the prior art, a multi-variate non-orthogonal control scheme may be employed in defining the relationship between the recipe set points and the sensors. A multi-variate non-orthogonal scheme may have two characteristics: (a) there is no one-to-one relationship between recipe set points and virtual sensor parameters, and (b) parameters from multiple sensors are used to determine virtual sensor parameters. In other words, a recipe set point may be associated with data collected from a plurality of sensors. Unlike the prior art, adjustments to the recipe set points may no longer be dependent just on data collected by the control-loop sensors. Instead, data collected by the independent sensors (and in one embodiment, by the control-loop sensors) may be employed alone or in conjunction with the control-loop sensors to determine and control certain chamber/plasma/substrate states.

To facilitate discussion, FIG. 3 shows, in an embodiment of the invention, a hierarchical relationship between the recipe/sensors/actuators. Consider the situation wherein, for example, substrate 212 is being processed in processing chamber 200. When the recipe is first initialized, recipe set points are provided. The recipe set points are traditionally dependent on measurements from the control-loop sensors. Traditionally, process module controller 208 may tune the recipe set points after a substrate or substrate lot has been processed using the data from the control-loop sensors (block 302). For ease of discussion, block 302 may be known as vector S.

However, as previously discussed, the data from the control-loop sensors may not always be accurate, and this may not be detectable especially if a uni-variate orthogonal relationship exists between a recipe set point and a control-loop sensor. Thus, if a control-loop sensor (such as pressure sensor 226) has a malfunction, reliance on data provided by the control-loop sensor may result in poor processing result and even a damaged substrate and may even damage chamber components.

To provide an independent source of data to verify the pressure data, for example, before tuning the recipe pressure set point, additional data may be provided through other control-loop sensors and independent sensors. The data may be acquired before or during the execution of the recipe but may be independent of the process control loop for the specified recipe set point (block 304). For ease of discussion, block 304 may be known as vector V.

In an embodiment, an empirical relationship (vector Q) may exist between block 302 and 304. Due to specific chamber conditions and individual sensor characteristics, which may vary due to manufacturing tolerance, the empirical relationship (vector Q) between vector S (302) and vector V (304) tends to be chamber specific.

As aforementioned, block 304 may be employed to verify the data provided by the control-loop sensors in block 302. In an example, independent sensor 264 may provide data that does not validate the data provided by pressure sensor 226. In other words, the data provided by independent sensor 264 indicates that the pressure does not need to be adjusted even though pressure sensor 226 may indicate otherwise.

However, just analyzing one parameter (such as the pressure level) or multiple directly measurable parameters may not provide all the data needed to drive the substrate and/or the plasma to the desired state. In order to more directly or more efficiently drive the process to the desired state, virtual sensors and/or virtual actuators may be provided (block 306). For ease of discussion, block 306 may be known as vector R.

As discussed herein, a virtual sensor refers to a composite sensor or a derivative of multiple sensors that may measure, in a virtual manner, parameters that may not be directly measured by a single sensor. Instead, the virtual sensor parameters may be calculated and/or inferred from data from a plurality of sensors. Examples of virtual parameters may include but are not limited to, for example, ion flux, ion energy, electron density, etch rate to deposition rate ratio, and the like.

In an embodiment, a phenomenological relationship (vector M) may exist between vector R and vector V. As discussed herein, a phenomenological relationship refers to a relationship in which parameters may be related and derivable from one another even if the relationship is non-linear or highly complex. Thus, to establish virtual sensors, an understanding of the phenomenological behavior (such as the underlying physics) of the recipe may be required, and in general may be expected to yield improvement over a purely statistical analysis providing the underlying model has validity. As a result, vector M tends to be specific to the type of process.

In an example, the geometry of the chamber, the state of the consumable parts, the accuracy of the gas flow controller, the accuracy of the pressure controller, the substrate, and other similar data may all influence the ion flux distribution. Accurately modeling the ion flux distribution by taking into account all of these influences may be highly complex and may take a long time. However, a phenomenological relationship may be defined in which the measurement of the RF voltage and current along with some electrical model of the processing chamber and the ion flux measurement at one location may be employed to derive the virtual sensor relating to ion flux, for example.

As can be appreciated from FIG. 3, traversing from block 302 to block 306 in a reliable manner may require the independent data stream (provided by block 304). Data from the independent data stream may be employed to calculate the measurements for the virtual sensors in block 306. In other words, real time metrology capability may be provided when the hierarchical relationship is traversed from block 302 to block 306 via block 304.

In an embodiment, real-time process control capability may be provided when an inverse hierarchical relationship is executed. In other words, when the system traverses from block 306 to block 302 via block 304, a set of virtual actuators may be implemented to tune the recipe. In an example, the electron density (a virtual sensor value) may be identified as being outside of the desired range. The gap between the set point electron density and the virtual electron density value may be calculated. In one embodiment, if the control-loop sensor has not drifted, then the calculated gap may be employed by the virtual actuator to tune the process to the desired set point. However, if the control-loop sensor has drifted slightly (as indicated by the independent sensors), the calculated gap may have to be modified in order to account for the drift before the recipe is tuned.

In an embodiment, the virtual actuator may be actuated in small increments. In an example, instead of applying the entire calculated gap to tune the recipe (in the above example), a small value may be first applied to insure that virtual actuator does not inadvertently exacerbate the problem. If an analysis after the small change indicates that the substrate, for example, is moving toward the desired state, further adjustments may be applied toward tuning the recipe. Advanced non-linear "leap ahead" adjustments such as steepest descent techniques may be employed where the parameter space is well behaved, but where it is more complex and ill conditioned a limited step-by-step approach may yield better results.

Figure 4:
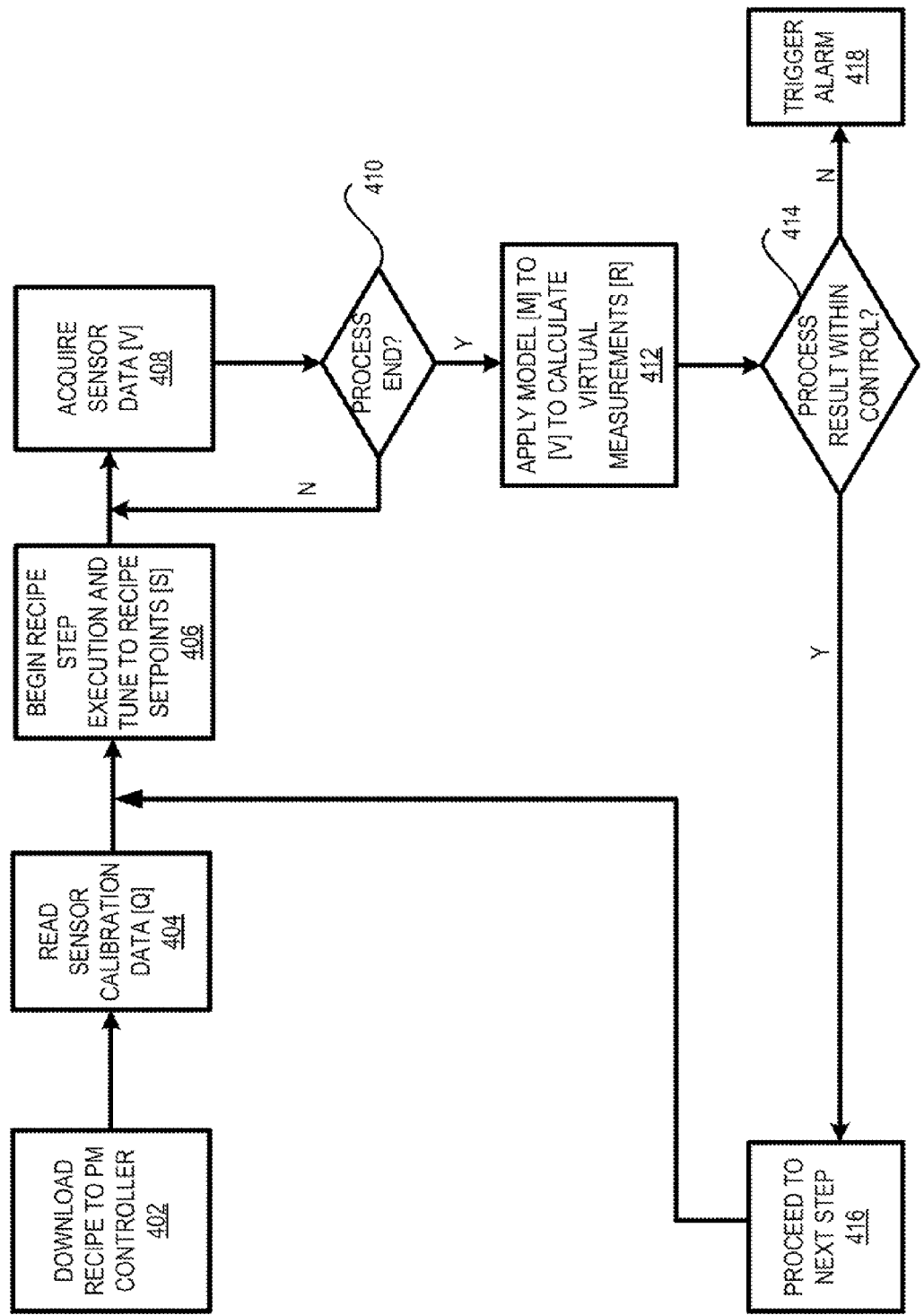
FIG. 4 shows, in an embodiment of the invention, a simple flow chart illustrating one implementation of the in-situ control process method for performing virtual metrology.

FIG. 4 shows, in an embodiment of the invention, a simple flow chart illustrating one implementation of the in-situ control process method for performing virtual metrology. As discussed herein, virtual metrology refers to acquiring measurement data including those not directly measurable without performing the actual measurement.

At a first step 402, a recipe is downloaded onto a process module controller. In an example, fabrication facility host controller 206 may send a recipe to process module controller 208 via communication link 210.

At a next step 404, sensor calibration data (vector Q) is provided. In an embodiment, the empirical relationship between the control-loop sensors and the independent sensors is provided to analysis computer 282.

At a next step 406, the downloaded recipe is executed, and the recipe is tuned to the recipe set point (as indicated in block 302).

At a next step 408, data is acquired during processing by the sensors.

At a next step 410, the system checks to determine if the process has stopped.

If the process has not stopped, the system returns back to step 408 to continue acquiring data.

However, if the process has stopped, the system proceeds to step 412 to determine if the desired result is attained. To make this determination without performing actual measurement, the hierarchical relationship may be applied in which the phenomenological model (vector M) is applied to block 304 (vector V) to calculate the virtual measurements (vector R).

At a next step 414, the system (such as analysis computer 282) may compare the virtual "measurements" against a predefined threshold. In this step, the system may review the process results to determine if the process results are within the control limits.

If the process results are within control limits, then at a next step 416, another substrate is loaded for processing and the system returned back to step 406.

However, if the virtual measurements fall outside predefined thresholds, then at a next step 418, the system may trigger a warning or alarm (typically the distinction is made between a warning which will alert the system and operator to the need for adjustment, diagnostic investigation and maintenance, whereas an alarm will halt processing pending corrective action to prevent substrate and or machine damage). In an embodiment, triggering of a warning or alarm may lead to fault detection, fault classification and/or tuning of the recipe.

As can be appreciated from FIG. 4, the in-situ control process provides a method for virtually performing processing measurement. Unlike the prior art, the substrate does not have to be removed from the chamber and measured using a physical metrology tool. Thus, the virtual metrology capability provided by this inventive system may reduce the cost of expensive metrology tools. Also, the virtual metrology capability may substantially reduce the time and resources required to perform metrology analysis. In addition, a human is not required to perform the measurement and analysis. Instead, the system (through the analysis computer, for example) may be configured to gather and compute the virtual measurement data automatically. An additional advantage of the invention is the ability to intervene during a process. Since deviations from the norm can be detected during recipe execution, a decision can be made on whether to continue a process or not before the wafer is irrecoverably damaged. In a lot of processes, the steps influencing the critical dimension the most are usually the mask open steps. The wafer is still recoverable through rework if the deviation is detected during the mask processing step.

Figure 5:
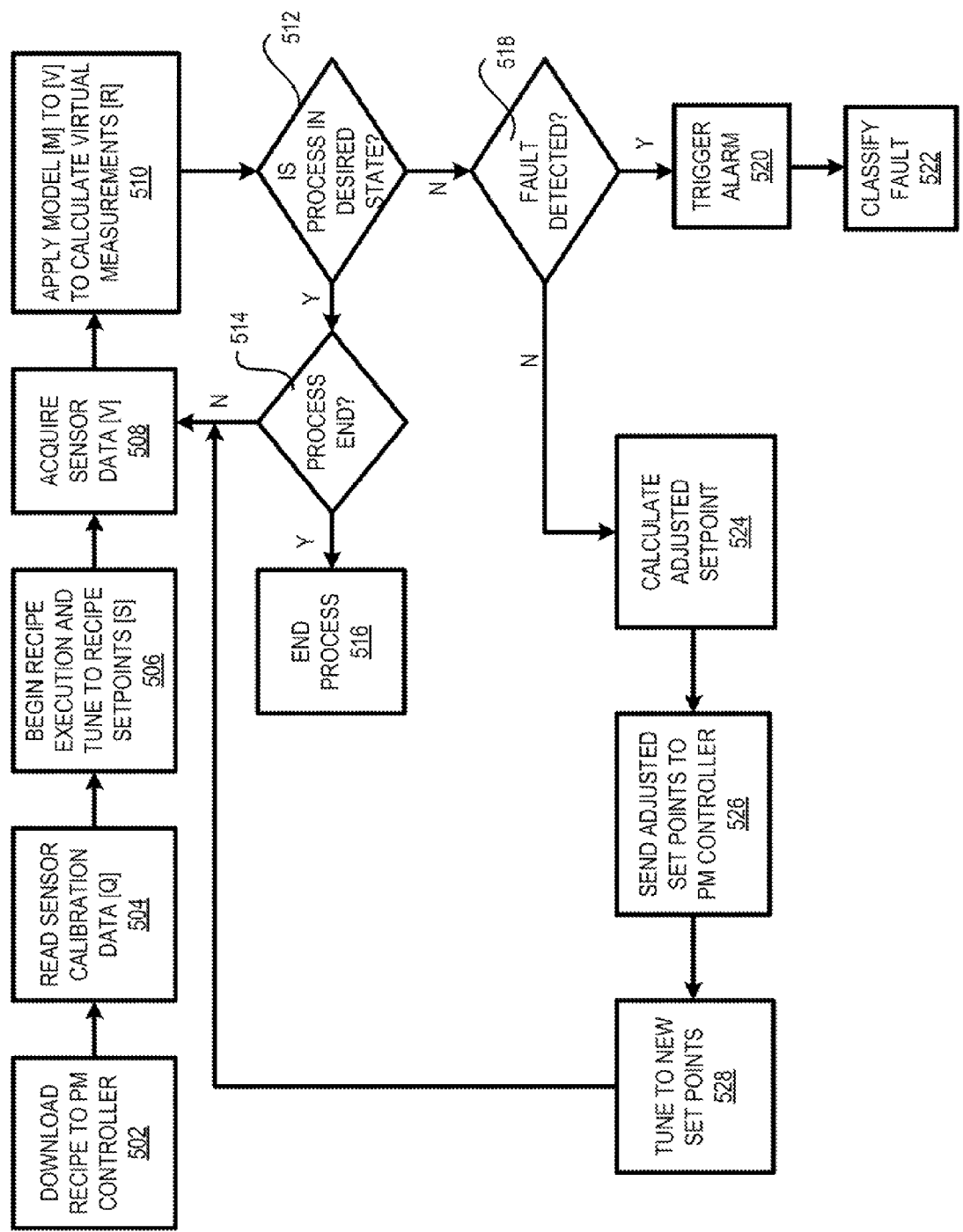
FIG. 5 shows, in an embodiment of the invention, a simple flow chart illustrating an implementation of the in-situ control process to provide real-time control capability.

FIG. 5 shows, in an embodiment of the invention, a simple flow chart illustrating an implementation of the in-situ control process to provide real-time process control capability.

At a first step 502, a recipe is downloaded onto a process module controller. In an example, fabrication facility host controller 206 may send a recipe to process module controller 208 via communication link 210.

At a next step 504, sensor calibration data (vector Q) is provided. In an embodiment, the empirical relationship between the control-loop sensors and the independent sensors may be provided to analysis computer 282.

At a next step 506, the recipe is executed and the recipe is tuned to the recipe set point (as indicated in block 302).

At a next step 508, data is acquired during processing. Data may be acquired at different time intervals. In one embodiment, data is acquired at a frequency of about ten Hertz, for example.

After the first set of data set has been acquired by analysis computer 282, at a next step 510, virtual measurements may be obtained. In other words, the hierarchical relationship may be applied in which a phenomenological model (vector M) may be applied to block 304 (vector V) to calculate the virtual measurements (vector R).

At a next step 512, the system may check to determine if the process is in the desired state.

If the process is within the desired state, then at a next step 514, the system may check to determine if the process has ended.

If the recipe is still being executed, then the system may proceed back to step 508 to acquire the next set of data.

However, if the process has stopped, then at a next step 516, the system stops processing.

Referring back to step 512, if the process is not within the desired state, then at a next step 518, the system may perform a check to determine if a fault has been detected.

If a fault has been detected, then at a next step 520, the system may trigger an alarm and at a next step 522, the fault may be classified.

However, if no fault has been detected, then at a next step 524, an adjusted recipe set point may be calculated. To determine the virtual actuator that may be applied to adjust the recipe, the hierarchical model may be applied. In an example, data has been collected from the control-loop and independent sensors. In addition, virtual sensors have been calculated based on the data collected and the phenomenological models that may exist between the independent data stream and the control-loop sensors. Once the virtual sensors have been determined, the virtual sensor measurements may be compared against the desired values. The differences may be employed by the virtual actuators to tune the recipe.

As previously mentioned, the raw differences may not be the actual value that may be sent to the process module controller for tuning a recipe. Instead, consideration may also have to be given to any potential noise or drift (vector V) to derive the new recipe set point.

After the new recipe set point has been determined, at a next step 526, the system may send the new recipe set point to the process module controller.

At a next step 528, the recipe is tuned to the new recipe set point.

Once the recipe has been tuned to the new recipe set point, the system may return to step 508 to acquire a new set of data.

As can be appreciated from FIG. 5, recipe fine-tuning may be performed during the execution of a recipe (real-time). Unlike the prior art, the tuning of the recipe may be validated by an independent data stream. Also, the set points that may be tuned are no longer limited to parameters that may be directly measured. Instead, parameters that may be dependent upon multiple parameters may be calculated and employed for set point purposes.

Also, actuators are not limited to the physical actuators available. A virtual actuator that, when activated, in turn activates a plurality of other physical actuators, may be employed. In this manner, process monitoring and control is essentially de-skilled.

As can be appreciated from the foregoing, methods and arrangements for providing an automatic in-situ process control scheme are provided. With an in-situ process control scheme, real-time control is provided in processing each substrate to the desired recipe state. The in-situ process control may also provide an in-situ method for performing fault detection and classification in real-time. Also, the in-situ control process may provide the tool with virtual metrology capability for determining the state of a processed substrate.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An arrangement for implementing an automatic in-situ process control scheme during execution of a recipe on a substrate within a processing chamber of a plasma processing system, comprising:

a plurality of control-loop sensors configured at least to collect a first set of sensor data to facilitate monitoring set points during said execution of said recipe, wherein said plurality of control-loop sensors being part of a process control loop;

a set of independent sensors configured at least to collect a second set of sensor data, said set of independent sensors being not part of said control-loop sensors;

a hub configure to at least receiving at least one of said first set of sensor data and said second set of sensor data;

an analysis computer communicably coupled with said hub and configured to perform analysis of at least one of said first set of sensor data and said second set of sensor data, wherein said analysis computer includes a high speed processor for analyzing a high volume of data.

2. The arrangement of claim 1 further including a fabrication facility host controller configured at least for selecting said recipe;

a process module controller configured at least for executing said recipe based on a given set of recipe set points; and a set of metrology tools configured for providing measurement data to at least one of said fabrication host controller and said analysis computer, wherein said measurement data is available for being integrated into said recipe.

3. The arrangement of claim 1 wherein said second set of sensor data collected by said set of independent sensors is configured to include at least a partial set of data already collected by said plurality of control-loop sensors.

4. The arrangement of claim 1 wherein said second set of sensor data collected by said set of independent sensors is configured to not include data already collected by said plurality of control-loop sensors.

5. The arrangement of claim 2 wherein said analysis computer is configured at least for receiving sensor calibration data, wherein said sensor calibration data includes an empirical relationship between said set of control-loop sensors and said set of independent sensors.

6. The arrangement of claim 5 wherein said sensor calibration data is chamber specific.

7. The arrangement of claim 5 wherein said analysis computer is configured at least for utilizing said second set of sensor data to verify said first set of sensor data.

8. The arrangement of claim 7 wherein said analysis computer is configured at least for establishing a set of virtual sensors, wherein each virtual sensor of said set of virtual sensors is associated with a set of virtual parameters that is being determined from sensor data collected from a plurality of sensors, wherein said plurality of sensors including sensors from at least one of said set of independent sensors and said set of control-loop sensors.

9. The arrangement of claim 8 wherein said set of virtual parameters includes at least one of ion flux, ion energy, electron density, and etch rate to deposition rate ratio.

10. The arrangement of claim 8 wherein said analysis computer is configured at least for establishing a phenomenological relationship between said virtual sensors and said second set of sensor data, wherein said phenomenological relationship includes at least one of parameters that are related, and parameters that are derivable from one another.

11. The arrangement of claim 10 wherein said analysis computer is configured at least for calculating virtual measurements to provide real-time metrology.

12. The arrangement of claim 11 wherein said analysis computer is configured at least for providing real-time process control capability by establishing a set of virtual actuators to tune said recipe if a set of virtual sensor values is outside of a predefined threshold.

13. The arrangement of claim 11 wherein said analysis computer is configured for sending outputs from said analysis to said process module controller, wherein said outputs including at least one of a set of virtual sensor set point adjustments, fault detection, classification, and multi-sensor endpoint.

14. The arrangement of claim 13 wherein said set of virtual sensor set point adjustments being utilized for adjusting at least one recipe set point.

15. A method for implementing an automatic in-situ process control scheme during execution of a recipe on a substrate within a processing chamber of a plasma processing system, comprising:

retrieving said recipe for substrate processing of said substrate;

providing sensor calibration data to an analysis computer, wherein said sensor calibration data includes an empirical relationship between a set of control-loop sensors and a set of independent sensors;

tuning said recipe to a set of recipe set points;

executing said recipe;

receiving a first set of sensor data from said set of control-loop sensors and a second set of sensor data from said set of independent sensors;

analyzing at least one of said first set of sensor data and said second set of sensor data to calculate a set of virtual measurements;

comparing said set of virtual measurements to a predefined threshold; and if said set of virtual measurements is outside of said predefined threshold, generating at least one of a warning and an alarm.

16. The method of claim 15 wherein said analyzing occurring at a predefined time interval.

17. The method of claim 16 wherein said virtual measurements is calculated based on applying a phenomenological model.

18. The method of claim 17 further including determining an existence of a fault if said set of virtual measurements is outside of said predefined threshold.

19. The method of claim 18 further including determining a set of adjusted recipe set points.

20. The method of claim 19 further including determining a set of virtual actuators for tuning said recipe.

* * * * *